(12) United States Patent
Chen et al.

(10) Patent No.: US 8,426,845 B2
(45) Date of Patent: Apr. 23, 2013

(54) LONG WAVELENGTH INFRARED SUPERLATTICE

(75) Inventors: Yiqiao Chen, Eden Prairie, MN (US); Peter Chow, Minnetonka, MN (US)

(73) Assignee: SVT Associates, Inc., EdenPrairie, MN (US)

( * ) Notice: Subject to any disclaimer, the term of this patent is extended or adjusted under 35 U.S.C. 154(b) by 203 days.

(21) Appl. No.: 13/102,863

(22) Filed: May 6, 2011

(65) Prior Publication Data

US 2011/0272672 A1    Nov. 10, 2011

Related U.S. Application Data

(60) Provisional application No. 61/332,705, filed on May 7, 2010.

(51) Int. Cl.
*H01L 21/00*      (2006.01)
(52) U.S. Cl.
USPC ........... 257/22; 257/14; 257/18; 257/21; 257/25; 257/64; 438/25; 438/38; 438/40; 438/41; 438/46
(58) Field of Classification Search .............. None
See application file for complete search history.

(56) References Cited

U.S. PATENT DOCUMENTS

| | | | |
|---|---|---|---|
| 3,626,257 A | 12/1971 | Esaki | |
| 4,450,463 A | 5/1984 | Chin | |
| 6,864,552 B2 | 3/2005 | Razeghi | |
| 6,906,358 B2 | 6/2005 | Grein | |
| 2002/0125472 A1 * | 9/2002 | Johnson et al. | 257/21 |

OTHER PUBLICATIONS

D. L Smith and C. Mailhiot, "Proposal for Strained Type II Superlattice Infrared Detectors," Journal of Applied Physics 62, p. 2545 (1987).
"Future Trends in Microelectronics: The Nano Millennium," edited by Luryi, Xu, and Zaslavsky, ISBN-10 #0471212474 (2002).
J. Kubacka-Traczyk, I. Sankowska, J. Kaniewski, "Interface Influence on Structural Properties of InAs/GaSb type-II Superlattices," Optica Applicata, vol. XXXIX, No. 4, p. 875 (2009).
H. J. Haugan, L. Grazulis, G. J. Brown, K. Mahalingam, D. H. Tomich, "Exploring Optimum Growth for High Quality InAs/GaSb Type-II Superlattices," Journal of Crystal Growth 261(4), pp. 471-478 (2004).
J. B. Rodriguez, P. Christol, L. Cerutti, F. Chevrier, A. Joullié, "MBE Growth and Characterization of Type-II InAs/GaSb Superlattice for Midinfrared Detection," Journal of Crystal Growth 274(1-2), pp. 6-13 (2005).
Y. Chen, A. Moy, K. Mi, and P. Chow, "High Performance Type II Superlattice Photo Diodes for Long Wavelength Infrared Applications," Proc. of the 16th International Conference on Molecular Beam Epitaxy, Berlin, Germany, Aug. 22-27, 2010.

\* cited by examiner

*Primary Examiner* — Kyoung Lee

(57) ABSTRACT

An embodiment of the present invention improves the fabrication and operational characteristics of a type-II superlattice material. Layers of indium arsenide and gallium antimonide comprise the bulk of the superlattice structure. One or more layers of indium antimonide are added to unit cells of the superlattice to provide a further degree of freedom in the design for adjusting the effective bandgap energy of the superlattice. One or more layers of gallium arsenide are added to unit cells of the superlattice to counterbalance the crystal lattice strain forces introduced by the aforementioned indium antimonide layers.

10 Claims, 4 Drawing Sheets

LONG WAVELENGTH INFRARED SUPERLATTICE

CROSS-REFERENCE TO RELATED APPLICATIONS

Figure 1:
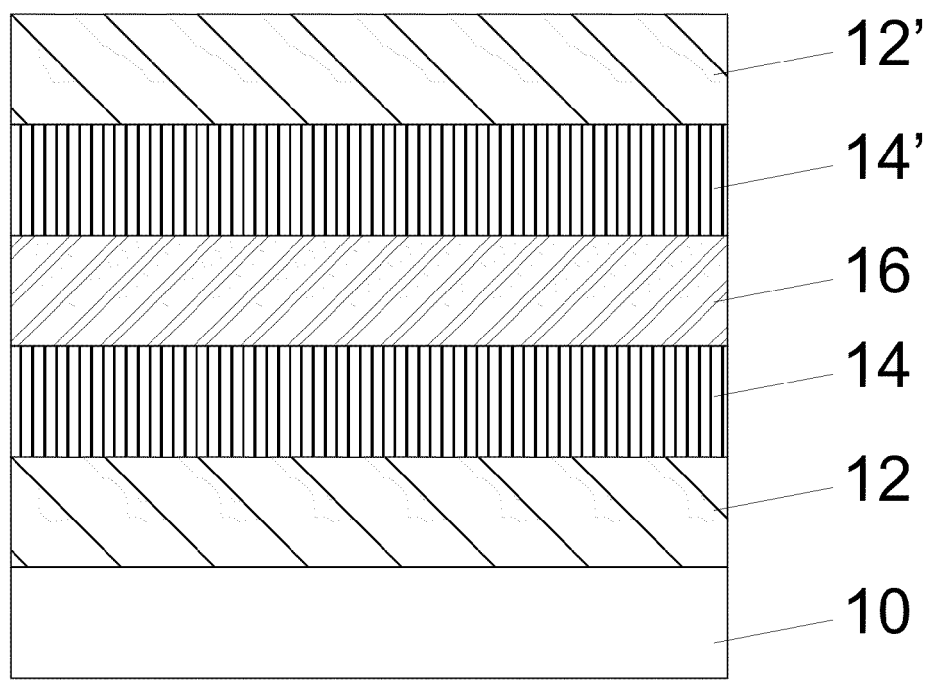

This application claims the benefit of the U.S. Provisional application Ser. No. 61/332,705, filed 2010 May 7 by the present inventors.

FEDERALLY SPONSORED RESEARCH

Not Applicable

SEQUENCE LISTING OR PROGRAM

Not Applicable

BACKGROUND

1. Field of the Invention

The present invention relates to the fabrication of semiconductor materials for application in optoelectronic devices operating in the infrared portion of the electromagnetic spectrum. Specifically, the repeated and deliberate deposition of thin layers such as indium arsenide (InAs), indium antimonide (InSb), gallium arsenide (GaAs) or gallium antimonide (GaSb), not necessarily in this order, forms a superlattice. This superlattice exhibits specific material properties, such as effective semiconductor bandgap energy, and these properties may be tailored by changing the individual layer thicknesses and/or layer constituents comprising said superlattice. The present invention may be employed in electronic and photonic devices used to detect and convey the presence of, or create, energy in the form of infrared light.

2. Prior Art

Scientific analysis and discussion of type-II superlattices relevant to the present invention are disclosed in the following publications, which will be referred to below:
1. D. L. Smith and C. Mailhiot, "Proposal for Strained Type II Superlattice Infrared Detectors," Journal of Applied Physics 62, p. 2545 (1987).
2. "Future Trends in Microelectronics: The Nano Millennium," edited by Luryi, Xu, and Zaslaysky, ISBN-10 #0471212474 (2002).
3. J. Kubacka-Traczyk, I. Sankowska, J. Kaniewski, "Interface Influence on Structural Properties of InAs/GaSb type-II Superlattices," Optica Applicata, Vol. XXXIX, No. 4, p. 875 (2009).
4. H. J. Haugan, L. Grazulis, G. J. Brown, K. Mahalingam, D. H. Tomich, "Exploring Optimum Growth for High Quality InAs/GaSb Type-II Superlattices," Journal of Crystal Growth 261(4), pp. 471-478 (2004).
5. J. B. Rodriguez, P. Christol, L. Cerutti, F. Chevrier, A. Joullié, "MBE Growth and Characterization of Type-II InAs/GaSb Superlattice for Mid-infrared Detection," Journal of Crystal Growth 274(1-2), pp. 6-13 (2005).
6. Y. Chen, A. Moy, K. Mi, and P. Chow, "High Performance Type II Superlattice Photo Diodes for Long Wavelength Infrared Applications," Proc. of the 16th International Conference on Molecular Beam Epitaxy, Berlin, Germany, Aug. 22-27, 2010.

The present invention herein improves on the layered structure known as an indium arsenide (InAs) and gallium antimonide (GaSb) type-II superlattice. The basic concept of the superlattice itself, as applied to semiconductors, was described by Esaki, Ludeke and Tsu in U.S. Pat. No. 3,626, 257 (1971). The foundation of their approach was to join a plurality of successive material layers so as to create a structure that exhibited a one dimensional spatial periodic variation in its band-edge energy. As science and engineering evolved to enable the realization of novel assemblies, Mailhiot and Smith disclosed a superlattice comprised of InAs and GaSb in an academic publication [reference 1 above]. Mailhiot and Smith described creating an artificial material comprising adjacent, alternating layers of InAs and GaSb. The particular constituents of this layered structure, those being InAs and GaSb, create a semiconductor material where the electronic energy band structures in adjacent layers form what is classified as a type-II interface, and such a structure is referred to as a type-II superlattice. Moreover, Mailhiot and Smith described that changing the thicknesses of the comprising layers within this type-II superlattice affects the effective bandgap energy exhibited by the material. Further discussion on the theory of this material is presented in the chapter "Infrared Detectors Based on InAs/GaSb Superlattices" from the book of reference 2 above. Such InAs/GaSb type-II superlattice structures have particular application to devices which interact with low energy photons classified in the midwave-infrared (MWIR), longwave-infrared (LWIR) and very longwave-infrared (VLWIR) portion of the electromagnetic spectrum.

Other inventions have been previously disclosed which combine multiple semiconductor layers for application to devices interacting with infrared photons, but these inventions rely on different scientific principles, or exhibit deleterious qualities, than the present invention. Raymond Chin in U.S. Pat. No. 4,450,463 (1984) described the assembly of layers to form multiple quantum wells. Because of the distinct energy levels which exist in such quantum wells, only photons within certain energy ranges could be absorbed by the quantum well, resulting in the promotion of electrical charge carriers which are then utilized to convey the detection of said photons. Quantum well infrared photodetectors (QWIP), such as the invention of Chin, only absorb photons arriving from a non-normally incident direction within the quantum well regions, and tend to be better suited for systems operating in the MWIR.

Razeghi in U.S. Pat. No. 6,864,552 described a focal plane array device employing the type-II superlattice structure previously presented by Malhiot and Smith. In Razeghi the specific materials disclosed in comprising the superlattice layers were InAs/GaSb, SiGe, InAs/Ga(x) In(1−x)Sb, and InAs/GaSb/AlSb. This limitation of specific layers with which to form the type-II superlattice creates a narrowed constraint in the design parameters of the realized device.

The presence of InAs and GaSb layers periodically adjacent to one another is only a subset of the qualities which define and affect the operating characteristics of a device employing such a type-II superlattice. The boundary between InAs and GaSb layers, that is the atomic bonding of specific atoms, occurs in one of two primary forms, these forms being a GaAs-like interface or a InSb-like interface. It is well known that the InSb-like interface plays an important role in achieving high quality InAs/GaSb superlattice materials grown on GaSb substrate, such as improving InAs/GaSb interface quality and balancing tensile strain introduced by InAs layer [reference 3 above]. Assertions have been presented which conclude that the type-II superlattice quality was negatively affected when the InSb layer was greater than 1 atomic monolayer [references 4 and 5 above].

BRIEF SUMMARY OF THE INVENTION

Both experimental data and theoretical analysis by the present inventors [reference 6] show that InSb layers play an important role in type-II superlattice structure, especially for operation in the LWIR portion of the electromagnetic spectrum. In particular, adjusting the optical cutoff wavelength of the superlattice by varying the InSb thickness is a much more effective means than by varying the thickness of InAs or GaSb constituent layers. The present invention is a new design for a type-II superlattice which incorporates thicker InSb layers, whose function is to extend the cutoff wavelength, and a thin GaAs intralayer inserted into InAs layers, which serves to balance the subsequent strain introduced by the aforementioned InSb layers. The application of GaAs intralayers within the superlattice overcomes the loss of superlattice quality due to the incorporation of InSb layers. Moreover, example calculations by the present inventors show that 2 atomic monolayers of GaAs inserted into a superlattice unit cell will not significantly affect the optical cutoff wavelength of the superlattice material. The exact thickness of the GaAs intralayer may be varied though in accordance with the thickness of the InSb layers employed in a specific realization of the present invention. Additionally, the existence of the GaAs intralayers within the InAs layers will help to reduce dark current and sidewall leakage since GaAs, with its much higher bandgap energy material, serves as a barrier for both electrons and holes in type-II superlattices. The present invention may be applied to the fabrication of optical detectors, such as photodiodes and photoconductors, or to light emitting devices, such as light emitting diodes and lasers.

DRAWINGS

Figure 2:
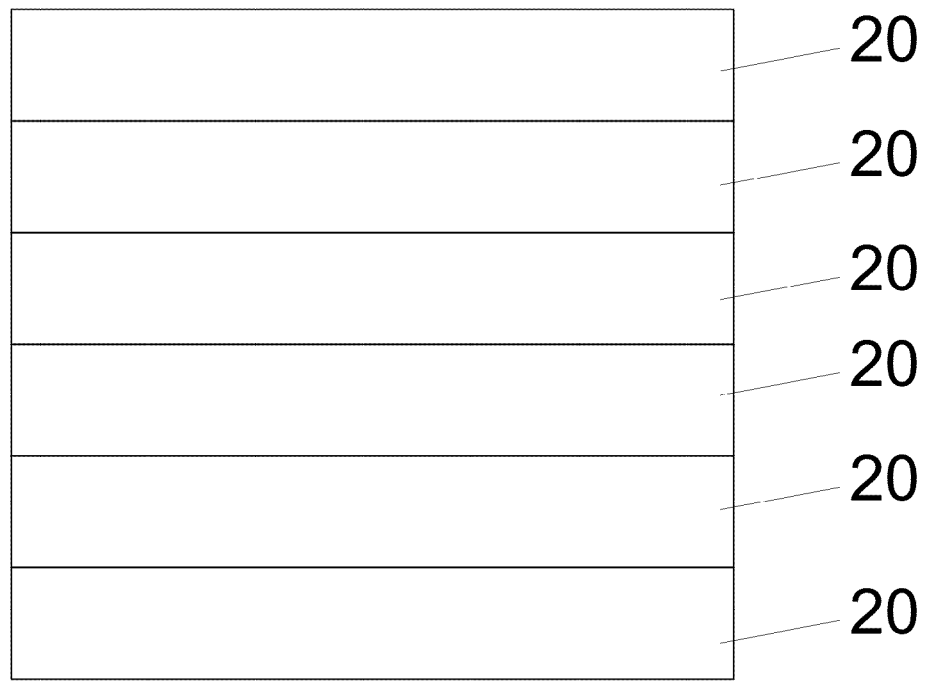
Figure 3:
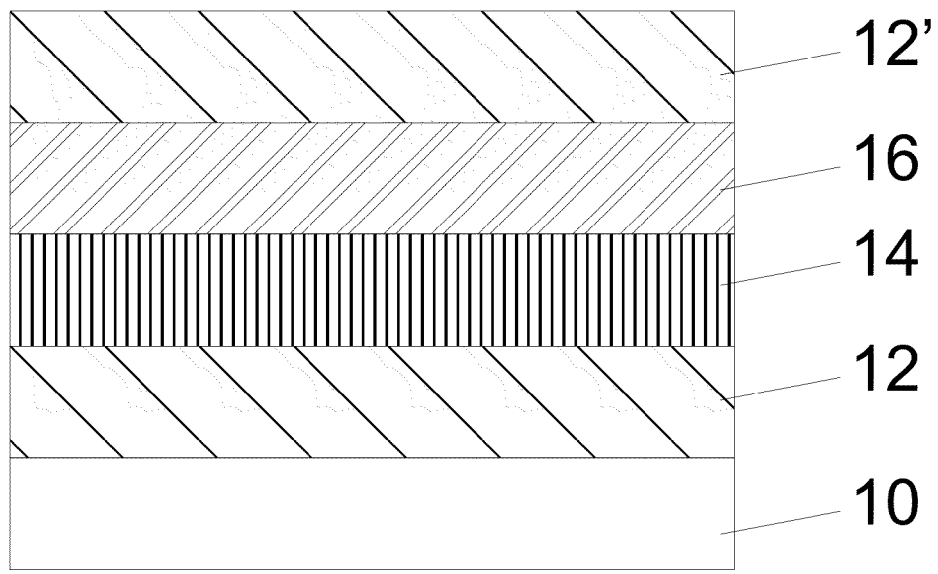
Figure 4:
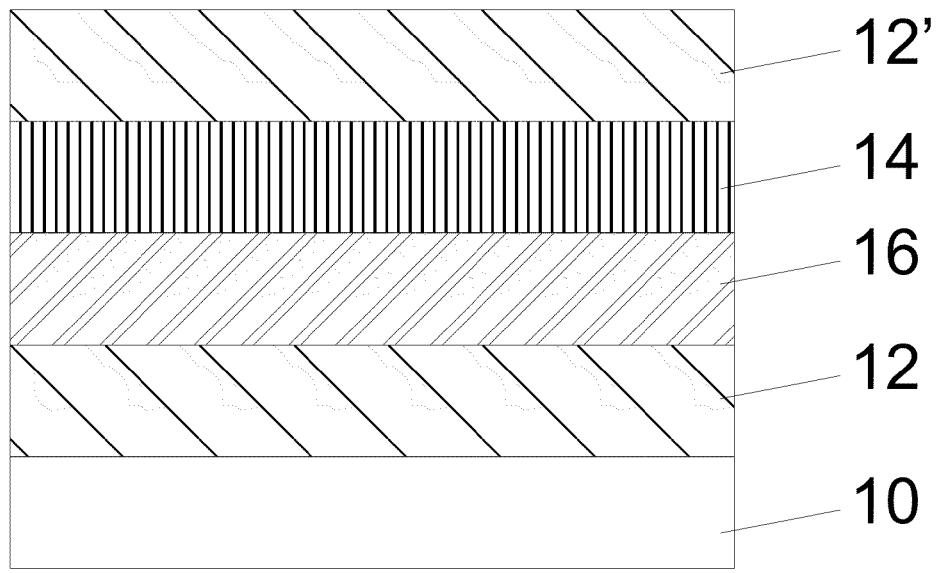
Figure 5:
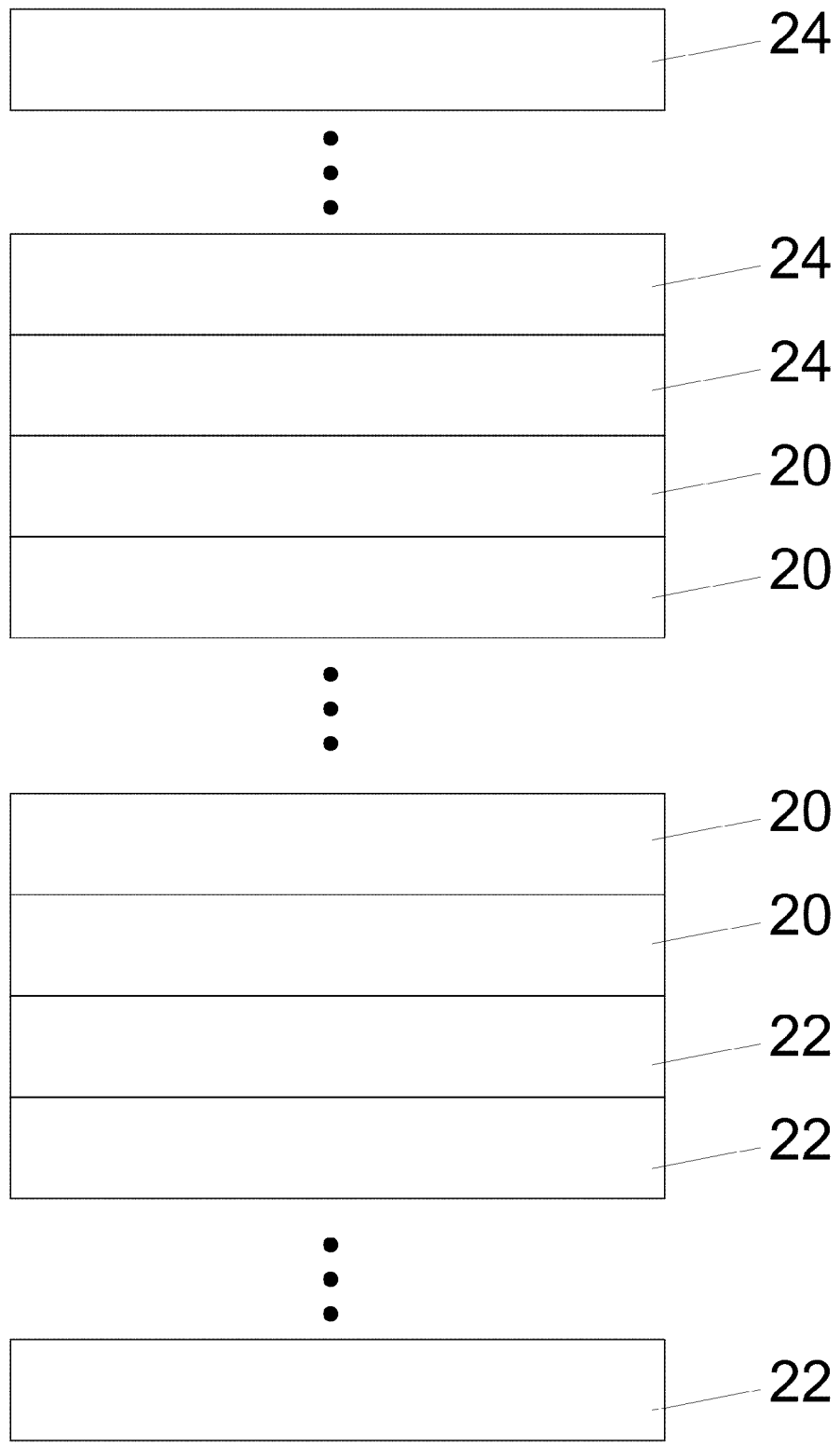

FIG. 1 is an illustration of a unit cell of the invention in best mode comprised of six distinct semiconductor layers FIG. 2 is an illustration of how the unit cells are repeated in an adjacent fashion in the formation of the semiconductor device FIG. 3 is an illustration of a unit cell of the invention in an alternative embodiment comprised of five distinct semiconductor layers FIG. 4 is an illustration of a unit cell of the invention in an alternative embodiment comprised of five distinct semiconductor layers FIG. 5 is an illustration of how unit cells, to which dopant atoms are added to modify electrical properties, are repeated and arranged in an adjacent fashion to form a superlattice with diodic properties

REFERENCE NUMERALS

10 Predominantly Gallium antimonide layer
12 Predominantly Indium antimonide layer
12' Predominantly Indium antimonide layer
14 Predominantly Indium arsenide layer
14' Predominantly Indium arsenide layer
16 Predominantly Gallium arsenide layer
20 Superlattice unit cell
22 P-type doped superlattice unit cell
24 N-type doped superlattice unit cell

DETAILED DESCRIPTION

FIG. 1 is an illustration of a unit cell of the superlattice in the best mode, consisting of six distinct layers. The first layer 10 consists predominantly of GaSb. Adjacent to 10 is layer 12, consisting predominantly of InSb. Adjacent to 12 is layer 14, consisting predominantly of InAs. Adjacent to 14 is intralayer 16, consisting predominantly of GaAs. Adjacent to 16 is layer 14', consisting predominantly of InAs. Adjacent to 14' is layer 12', consisting predominantly of InSb.

FIG. 2 is an illustration of how multiple instances of the unit cell 20 are arranged to form the superlattice in the application of the present invention.

FIG. 3 is an illustration of a unit cell of the superlattice in an alternative embodiment, consisting of five distinct layers. The first layer 10 consists predominantly of GaSb. Adjacent to 10 is layer 12, consisting predominantly of InSb. Adjacent to 12 is layer 14, consisting predominantly of InAs. Adjacent to 14 is layer 16, consisting predominantly of GaAs. Adjacent to 16 is layer 12', consisting predominantly of InSb.

FIG. 4 is an illustration of a unit cell of the superlattice in an alternative embodiment, consisting of five distinct layers. The first layer 10 consists predominantly of GaSb. Adjacent to 10 is layer 12, consisting predominantly of InSb. Adjacent to 12 is layer 16, consisting predominantly of GaAs. Adjacent to 16 is layer 14, consisting predominantly of InAs. Adjacent to 14 is layer 12', consisting predominantly of InSb.

FIG. 5 is an illustration of how multiple instances of unit cells 20, 22 and 24 are arranged to form a superlattice with diodic properties. Unit cells 20, 22 and 24 all have in common a layered structure comprised predominantly of InAs, InSb, GaSb, and GaAs in the best mode. A small number of atoms are additionally added to 22 such as to create material which is electrically p-type as known in the semiconductor field. A small number of atoms are additionally added to 24 such as to create material which is electrically n-type as known in the semiconductor field.

Assembly and Operation

In operation the user will deposit semiconductor layers onto a host substrate in a deposition chamber where the layer composition and layer thickness can be reasonably controlled. Examples of current technology to achieve this deposition include molecular beam epitaxy (MBE) and metal-organic chemical vapor deposition (MOCVD). However realization of the present invention is not necessarily limited to these specific thin film deposition techniques. Layers forming the unit cell 20 will be deposited in a specific order, and deposition of the layers forming the unit cell 20 shall be repeated until a desired total superlattice thickness is reached.

In the best mode, the unit cell forming 20 is comprised by the layers 10, 12, 14, 16, 14' and 12', in this order, as illustrated in FIG. 1. The thickness of layer 16, comprised predominantly of GaAs, should be chosen to balance the crystal strain force perturbation created by layers 12 and 12', each comprised primarily of InSb.

This invention is not limited to specific layer thicknesses nor a specific number of repetitions of the unit cell. However, to convey the physical scale of the invention, an example structure could use a unit cell consisting of a 7 monolayer thick GaSb 10, 2 monolayer thick each InSb 12 and 12', 9 monolayer thick each InAs 14 and 14', and 2 monolayer thick GaAs 16, organized in the manner of FIG. 1. This unit cell is repeated such that the total thickness of the formed superlattice is on the order of 3 microns.

Thicknesses of InSb layers 12 and 12' may but need not necessarily be identical. Thicknesses of InAs layers 14 and 14' may but need not necessarily be identical. Trace amounts of other atoms or molecules (dopants) may be added to any of the layers 10, 12, 12', 14, 14', or 16 so as to affect the electrical conductivity of the unit cell. Given a basic design for the thicknesses of 10, 12, 12', 14, 14', and 16 forming a unit cell 20, p-type electrical dopants are added during the deposition of these constituent layers to form unit cell 22 with p-type electrical properties. In similar form, again starting with a basic unit cell design 20, n-type electrical dopants are added during the deposition of these constituent layers to form unit cell 24 with n-type electrical properties. Combining multiple instances of 22, and multiple instances of 20, and multiple instances of 24, in this order, a p-i-n electrical junction may be formed within the superlattice (FIG. 5). The type-II superlattice diode resulting from the present invention may then be implemented as an infrared light detecting photodiode, or as an infrared light emitting diode or laser.

In the application of this invention to creating a photodetector, external electrical contacts would be made to the superlattice device such that when the superlattice device is exposed to particular wavelengths of light, an external electrical current is generated. This electrical current may then be analyzed to indicate the presence of light at the particular wavelength or band of wavelengths of interest. Light impinging upon the superlattice with photon energies greater than the effective bandgap energy of the superlattice will be absorbed by the superlattice, creating an electron-hole pair within the superlattice material, which will then drive an external electrical current. The greater intensity of the light of sufficient photon energy reaching the superlattice, the greater the external signal current will be, up to a point of saturation. Photons with energies less than the superlattice bandgap energy will not induce appreciable external signal current from the superlattice device.

In the application of this invention to creating a light emitter, external electrical contacts would be made to the grown type-II superlattice material of the present invention, wherein the superlattice material was deposited in such a manner so as to exhibit diodic properties. Electrical current is externally applied to flow through the superlattice material. As this current flows through the superlattice device, electrons and holes recombine across the superlattice energy bandgap, resulting in the emission of photons whose photon energies are comparable to that of the superlattice bandgap.

EXAMPLE

The present invention need not be necessarily actualized by a particular growth method, nor is realization limited to a specific host substrate. However the following discussion will present an example on how to apply the novel type-II superlattice of the present invention to the creation of an infrared detector structure.

The type-II superlattice may be epitaxially grown using the molecular beam epitaxy (MBE) technique. In this method high purity elemental material, such as In, Ga, As, Sb, Si and Be are individually isolated within a high vacuum chamber. Each elemental source is individually heated, creating a vapor composed of that element. The vapors can then be individually directed toward the growth substrate for specific and deliberate time duration, where the vapors recombine on the substrate surface and form the desired semiconductor material.

A p-type GaSb host substrate may be loaded into the growth chamber of this MBE system. The GaSb substrate is heated in the growth chamber until residual surface oxidation on the substrate is removed. A 0.5 micron thick p-type GaSb: Be buffer layer is then grown on this substrate to ensure a high quality GaSb surface upon which the superlattice will deposit. For this example a basic unit cell consists of the following layers in this order: 2.1 nm GaSb/0.3 nm InSb/2.3 nm InAs/0.5 nm GaAs/2.3 nm InAs/0.3 nm InSb. Each unit cell corresponds to a thickness of 7.8 nm.

On top of the aforementioned GaSb:Be buffer layer, 64 periods of the unit cell are grown. During this time, the p-type dopant Be is added to the unit cell, creating in total 0.5 microns of p-type superlattice. Next 256 periods of the superlattice unit cell are grown without the intentional addition of any dopants. This forms an electrically intrinsic region approximately 2 microns in thickness. 64 periods of the unit cell are then grown, where Si is added as an n-type dopant during this growth, creating a 0.5 micron thick n-type superlattice layer.

Overall this example process has created a type-II superlattice p-i-n diode, with a total diode thickness of 3 microns. Following growth, electrical contact metals are added to the grown wafer following practices common in the industry, where the negative electrical contact is on the front epitaxial side of the wafer, and the positive electrical contact is on the back side of the wafer. This example structure can now be utilized as a photodiode device used to detect the presence and quantity of certain spectral bands of infrared light. Additional post-growth processing steps common in the field may also be undertaken, such as the etching of valleys to form pixel mesas, the thinning of the host substrate to improve device performance, or the mating of the photodiode to electrical readout circuitry.

Alternative Embodiments

Variations of the invention exist which the user may choose to employ. These variations do not change the overall spirit of the invention being that the type-II InAs/GaSb superlattice may be enhanced by the addition of InSb and/or GaAs intralayers. FIGS. 3 and 4 illustrate the alternative embodiment of a unit cell employing five distinct layers, where the predominantly GaAs layer 16 is directly adjacent to a predominantly InSb layer 12' or 12, respectively.

Further variations of the superlattice are also possible. For example, a unit cell could employ two or more instances of GaAs layers within the unit cell. Or the GaSb layer may be substituted with an aluminum gallium antimonide (AlGaSb) compositional alloy. The choice of substrate is not necessarily limited. The superlattice of the present invention may be deposited on GaSb-based substrates, InAs-based substrates, or other substrates chosen by the practitioner. Such minor deviations from the best mode continue to fall within the scope of the invention described in this patent application.

Conclusion, Ramifications, And Scope

The novel design for a type-II superlattice of the present invention advances the applicability of this class of materials to the realization of infrared optical devices. The effective bandgap energy of the superlattice may be more easily tailored during growth by adjusting the InSb layer thickness, compared to adjusting only the InAs or GaSb layer thicknesses as had been exercised by previous practitioners. Addition of the GaAs intralayer balances the strain introduced by the thicker InSb layers without harming the effective bandgap energy of the superlattice. The addition of the GaAs intralayer also increases the resistance-area product value of the superlattice device when the superlattice device is employed as a photodiode. Larger resistance-area product values result in reduced noise and higher detectivities in photodiode devices.

This invention has already been demonstrated by the present inventors in the creation of type-II superlattice infrared photodetector structures via molecular beam epitaxy (MBE) growth technology. However, this invention is not limited to any particular semiconductor growth approach and may be equally applied to other technologies such as, but not limited to, metal-organic chemical vapor deposition. The present invention is not limited to a particular host substrate. Given the physical lattice constants of the materials involved, GaSb is typically employed as the host substrate. However, InAs is also physically compatible with the materials and offers advantages over GaSb substrates, such has higher infrared light transmission and reduced difficulties with n-type doping.

In the best mode, one unit cell of the invention consists of 6 adjacent layers. The first layer is comprised primarily of GaSb material. The second layer is comprised primarily of InSb material. The third layer is comprised primarily of InAs material. The fourth layer is comprised primarily of GaAs material. The fifth layer is comprised primarily of InAs material. The sixth layer is comprised primarily of InSb material. Multiple instances of this unit cell, as defined by the six layers, are repeated adjacent to one another in the formation of the superlattice. However in alternative embodiments of this invention unit cells may use a different number of layers while achieving the same effects.

The addition of the InSb and GaAs intralayers to the classic InAs/GaSb type-II superlattice provides for increased degrees of freedom in the superlattice design without compromising the device operating characteristics. The present invention makes the realization of LWIR and VLWIR devices based type-II superlattices more attainable and creates a viable alternative to previous generation technologies such mercury cadmium telluride and bolometers.

We claim:

1. An artificial type-II superlattice material consisting of repeated unit cells with each said unit cell comprising:
   a predominantly GaSb layer with thickness of less than 10 nanometers,
   a predominantly InSb interfacial layer with thickness of less than 5 nanometers,
   a predominantly InAs layer with thickness of less than 10 nanometers,
   a predominantly GaAs strain balancing intralayer of less than 5 nanometers.

2. The artificial type-II superlattice material of claim 1 deposited on a substrate, wherein said substrate is predominantly composed of GaSb.

3. The artificial type-II superlattice material of claim 1 deposited on a substrate, wherein said substrate is predominantly composed of InAs.

4. The artificial type-II superlattice material of claim 1 deposited on a substrate, wherein said substrate is predominantly composed of Si.

5. The artificial type-II superlattice material of claim 1 deposited on a substrate, wherein said substrate is predominantly composed of Ge.

6. The artificial type-II superlattice material of claim 1 whereby dopant atoms are added to said superlattice material such that said superlattice material exhibits p-type electrical properties.

7. The artificial type-II superlattice material of claim 1 whereby dopant atoms are added to said superlattice material such that said superlattice material exhibits n-type electrical properties.

8. The artificial type-II superlattice material of claim 1 whereby different dopant atoms are added to said superlattice material at different times during the deposition of said superlattice material such that said superlattice material exhibits diodic electrical properties.

9. The artificial type-II superlattice material of claim 1 deposited by the molecular beam epitaxial growth technique.

10. The artificial type-II superlattice material of claim 1 deposited by metal-organic chemical vapor deposition technique.

* * * * *